(12) United States Patent
Furuichi

(10) Patent No.: US 6,623,800 B2
(45) Date of Patent: Sep. 23, 2003

(54) METHOD FOR FORMING COMPOSITE VAPOR-DEPOSITED FILM HAVING VARIED FILM COMPOSITION AT INITIAL AND FINAL STAGES OF VAPOR DEPOSITION, COMPOSITE VAPOR-DEPOSITION MATERIAL FOR PRODUCING THE SAME, AND METHOD FOR PRODUCING THE COMPOSITE VAPOR-DEPOSITION MATERIAL

(75) Inventor: Shinji Furuichi, Mohka (JP)

(73) Assignee: Hitachi Metals Ltd., Tokyo (JP)

( * ) Notice: Subject to any disclaimer, the term of this patent is extended or adjusted under 35 U.S.C. 154(b) by 198 days.

(21) Appl. No.: 09/880,003

(22) Filed: Jun. 14, 2001

(65) Prior Publication Data

US 2001/0055696 A1 Dec. 27, 2001

(30) Foreign Application Priority Data

Oct. 31, 2000 (JP) ........................ 2000-331931
Jun. 26, 2000 (JP) ........................ 2000-190969

(51) Int. Cl.⁷ ................................ C23C 14/24
(52) U.S. Cl. ............... 427/250; 427/255.23; 427/255.7; 427/64; 427/124
(58) Field of Search ............. 427/64, 124, 250, 427/255.23, 255.7

(56) References Cited

U.S. PATENT DOCUMENTS 3,615,945 A * 10/1971 Yokozawa .................. 438/547
3,703,401 A    11/1972 Deal et al.
2002/0024289 A1 * 2/2002 Nikaido et al. ............. 313/466

* cited by examiner

Primary Examiner—Timothy Meeks
(74) Attorney, Agent, or Firm—Sughrue Mion, PLLC

(57) ABSTRACT

A method for forming a composite vapor-deposited film which is suitable for the deposition on the fluorescent screen of a color television picture tube and the like and in which one side has a high light-reflectance and the other side has a property of absorbing heat rays, and a composite vapor-deposition material suitable for vacuum vapor deposition therefor are disclosed. This composite vapor-deposition material has an aluminum envelope and a low vapor-pressure metal/metalloid compound powder in the its core region. It is desirable that the low vapor-pressure metal/metalloid compound powder is dispersed and retained with aluminum in the core region. Vacuum vapor deposition carried out employing this composite vapor-deposition material yields a composition of almost 100% aluminum at the first stage of the vapor deposition, and subsequently forms a layer containing the low vapor-pressure metal/metalloid compound, from which the low vapor-pressure metal/metalloid compound is not diffused into the aluminum layer formed at the initial stage of the vapor deposition, even though heat treatment is applied. Therefore, a reflection layer having a high light-reflectance can be maintained.

10 Claims, 6 Drawing Sheets

METHOD FOR FORMING COMPOSITE VAPOR-DEPOSITED FILM HAVING VARIED FILM COMPOSITION AT INITIAL AND FINAL STAGES OF VAPOR DEPOSITION, COMPOSITE VAPOR-DEPOSITION MATERIAL FOR PRODUCING THE SAME, AND METHOD FOR PRODUCING THE COMPOSITE VAPOR-DEPOSITION MATERIAL

FIELD OF THE INVENTION

The present invention relates to a method for forming a composite vapor-deposited film having a varied film composition at initial and final stages of vapor deposition by means of continuous vacuum vapor deposition and to a composite vapor-deposition material suitable for use in vacuum vapor-deposition therefor. In particular, the present invention relates to a method for forming a composite vapor-deposited film which has a highly varied film composition as in a reflection film and a light-absorption film attached on fluorescent material of a cathode ray tube like a color television picture tube and to a composite vapor-deposition material suitable for use in vacuum deposition therefor.

DESCRIPTION OF THE RELATED ARTS

There is a need for obtaining a vapor-deposited film having plural laminated layers with different properties by means of a continuous vacuum vapor deposition process. In a cathode ray tube like a color television picture tube, for example, the inner surface of its face plate is coated with three-color fluorescent materials in the shape of dots or stripes, and a thin film layer having a high light-reflectance like aluminum is formed on this fluorescent material at the side opposite to the face plate, so that the aluminum thin film layer reflects light running inside the CRT of the visible light emitted from the fluorescent material and plays a role of increasing the amount of the light running through the face plate. In addition, on the backside of the fluorescent screen, a shadow mask or aperture grille is positioned which is a color selecting electrode to control the landing position of the electron beam on the fluorescent screen. This electrode transmits about 20% of the electron beam from the electron gun to the side of the fluorescent screen, and shields the remaining, about 80% of the electron beam. This about 80% of the electron beam will contribute to an increase in the temperature of the color selecting electrode. As the temperature increases, heat radiation from the color selecting electrode takes place, and this heat radiation converges on the closest fluorescent screen, so that most of the heat radiation is reflected by the aluminum thin film layer on the fluorescent screen. The reflected heat reaches the color selecting electrode again, and thus raises the electrode temperature to a greater extent. As the temperature rises, the color selecting electrode will undergo thermal expansion, causing its deformation. Consequently, it will be likely to result in mismatching the electron beam.

As described in U.S. Pat. No. 3,703,401, the surface of the aluminum thin film layer attached on the fluorescent screen is coated with a carbon coating, such that radiant heat from the color selecting electrode is absorbed by the heat absorption effect of the carbon coating. However, such a carbon coating must be dissolved in a solvent such as an organic solvent and the like to spray it for coating, and furthermore, it is necessary to carry out this coating step separately from a vapor deposition process of aluminum onto the fluorescent screen. Accordingly, these make not only the step troublesome, but also its continuous operation impossible.

When carbon or nickel with a property of absorbing heat rays and aluminum with a high light-reflectance are vaporized simultaneously in vacuum, it is possible to obtain a composite vapor-deposited film having an aluminum-rich composition at the initial stage of the vapor deposition and a carbon- or nickel-rich composition at the final stage of the vapor deposition, since the vapor pressure of aluminum is different from that of carbon and nickel. The aluminum-rich composition formed at the initial stage of the vapor deposition, however, contains large amounts of carbon or nickel, causing a decreased reflectance. Also, the carbon- or nickel-rich composition formed at the final stage contains large amounts of aluminum, and thus the property of absorbing heat rays cannot be satisfactory.

On the other hand, it is possible to form a vapor-deposited film of a two-layer structure having a fully different composition by loading the initial vapor-deposition material, aluminum, on a vacuum depositing tray to form a vapor-deposited film, followed by loading a vapor-deposition material different from the initial vapor-deposition material, such as carbon or nickel, on the vacuum depositing tray to carry out vapor deposition. However, this process requires two vapor deposition operations.

Deposition of chromium or iron having a property of absorbing heat rays is also carried out after the vacuum vapor depositing of aluminum having a high light-reflectance. In the composite vapor-deposited film having a layer of chromium or iron deposited on the aluminum layer, when heated to several hundred degrees centigrade after the vapor deposition, the chromium or iron may be diffused within the composite vapor-deposited film, resulting in mixing of the chromium or iron into the aluminum and a reduced light-reflectance of the aluminum layer. This leads to decreasing the brightness of a CRT.

SUMMARY OF THE INVENTION

Therefore, an object of the present invention is to provide a method for forming a composite vapor-deposited film capable of obtaining a CRT with superior brightness by means of continuous vacuum vapor deposition.

Another object of the present invention is to provide a composite vapor-deposition material and a method for producing the same which allows vapor deposition of an aluminum layer having high light-reflectance at an initial stage of the vapor deposition and subsequent, continuous vacuum vapor deposition of a layer having a property of absorbing heat rays, and at the same time, is suitable for forming a composite vapor-deposited film whose composition is not varied, even if receiving a heat history thereafter.

A further other object of the present invention is to provide a composite vapor-deposition material and a method for producing the same which is capable of enhancing brightness of a CRT by vapor depositing a layer of aluminum having high light-reflectance at an initial stage of the vapor deposition, and then continuously vacuum vapor depositing over the layer a layer having a tendency of transmitting a electron beam and a property of absorbing heat rays.

Therefore, a method for forming a composite vapor-deposited film according to the present invention which is capable of making a CRT with superior brightness by continuous vacuum vapor deposition comprises heating under reduced pressure a composite vapor-deposition material having an aluminum body and powder of a low vapor-pressure metal/metalloid compound retained in a core region of the aluminum body, vaporizing aluminum and low vapor-pressure metal/metalloid compound in series, and vapor depositing them on a substrate to be deposited.

In the specification, when materials of different types are heated under the same vacuum, a material which vaporizes at a low temperature is defined as a high vapor-pressure material, and a material which vaporizes at an elevated temperature is defined as a low vapor-pressure material. In the present invention, aluminum is utilized as a high vapor-pressure material. A metal/metalloid compound, for example, an oxide, carbide, and nitride, vaporizes at higher temperatures than aluminum, and are sometimes referred to as a low vapor-pressure material or low vapor-pressure metal/metalloid compound.

The above-mentioned low vapor-pressure metal/metalloid compound is of powder, and a composite vapor-deposition material having a structure in which such powder is dispersed and retained with aluminum in the core region of the aluminum body can be utilized to form a composite vapor-deposited film by continuous vacuum vapor deposition. As low vapor-pressure metal/metalloid compound powder can be employed an oxide, nitride, carbide, silicide, nitro-oxide, carbo-nitride, carbo-oxide, silico-oxide, silico-nitride, or boride of a metal/metalloid element. As a metal/metalloid element, at least one element can be selected from the group consisting of Li, Be, Mg, Ca, Ti, V, Nb, Ta, Cr, Mo, W, Mn, Fe, Co, Ni, B, Al, C, Si, Sn, and Pb. Among these metal/metalloid elements, an element having an atomic number of 20 or less (at least one element selected from the group consisting of Li, Be, B, C, Mg, Al, Si, and Ca) is preferable, since such a element has a low level of absorbing the electron beam, so that the brightness of a CRT can be increased even in the case where the same accelerating voltage is applied. Preferable low vapor-pressure metal/metalloid compounds are nickel oxide, iron oxide, silicon carbide, aluminum nitride, boron nitride, and magnesium boride.

This composite vapor-deposition material can possess a foil or layer of a metal having a further lower vapor pressure, preferably tantalum, rhenium, tungsten, molybdenum, or the like, which surrounds the core region.

The composite vapor-deposition material of the present invention can take a composite structure in which powder of a low vapor-pressure metal/metalloid compound is dispersed and retained with aluminum in the core region of an aluminum body by integrally cold working an aluminum envelop with a hollow inside and a mixture of aluminum powder and powder of a low vapor-pressure metal/metalloid compound which is filled in the hollow.

It is preferable that the low vapor-pressure metal/metalloid compound powder has a particle size of not more than 3 $\mu$m for 70% or more of the number of particles. It is desirable that the average particle size of the low vapor-pressure metal/metalloid compound powder is between 0.05 $\mu$m and 4 $\mu$m, and preferably between 0.05 $\mu$m and 2 $\mu$m. It is preferable that the core region of the aluminum body has an apparent specific gravity of 40% to 90% of the true specific gravity.

The method for producing a composite vapor-deposition material according to the present invention comprises the steps of mixing aluminum powder and powder of a metal/metalloid compound having a vapor pressure lower than that of aluminum, filling the mixed powder into an aluminum envelope, and subjecting the envelope to cold working to reduce the diameter thereof, thereby forming a composite structure in which the low vapor-pressure metal/metalloid compound powder is dispersed in the core region of the envelope. Preferably, the above-mentioned cold working is done as cold wire drawing. It is preferable that the total reduction rate is 75% or higher in the cold wire drawing. It is preferable that the mixed powder has an angle of repose of not more than 60 degrees, and preferably not more than 45 degrees.

In the method for producing a composite vapor-deposition material according to the present invention, it is also possible to cut and remove an end region including the closed portion of wire-drawn aluminum envelopes, and to connect them at their cut portions by welding, followed by further cold wire drawing.

DETAILED DESCRIPTION OF THE PREFERRED EMBODIMENTS

Figure 1:
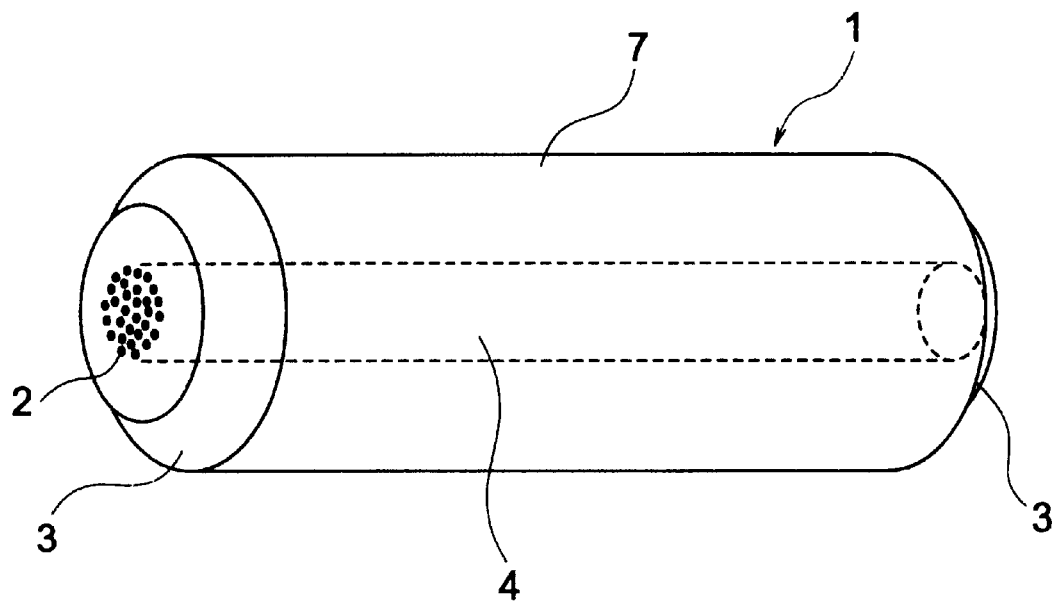
FIG. 1 is a perspective view of a composite vapor-deposition material according to a first embodiment of the present invention.
Figure 2:
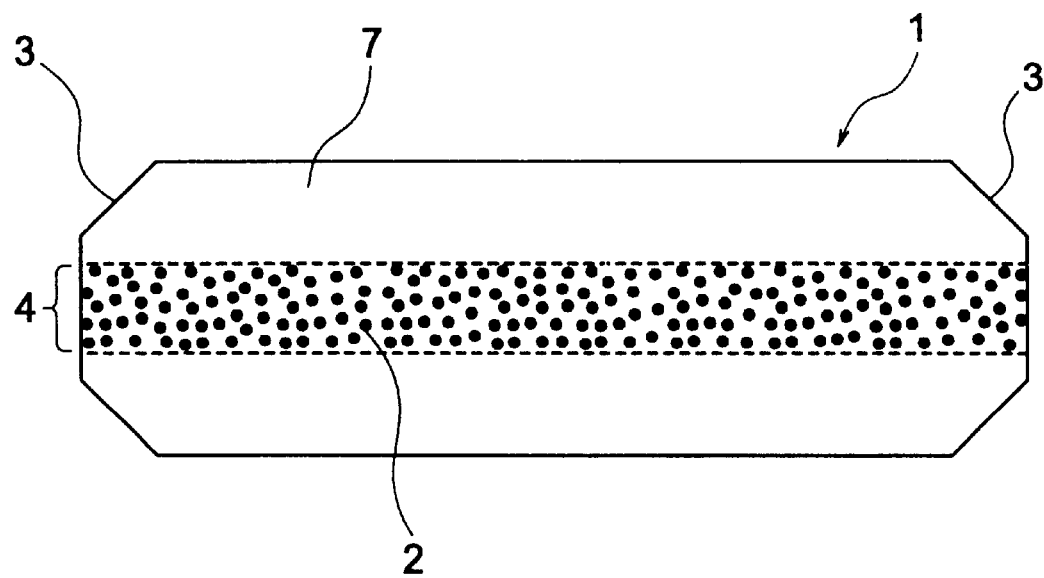
FIG. 2 is a cross-sectional view of a composite vapor-deposition material according to the first embodiment of the present invention shown in FIG. 1.

The present invention will be described in more detail with reference to the drawings. FIG. 1 is a perspective view of a first embodiment of a composite vapor-deposition material according to the present invention, and FIG. 2 is a cross-sectional view of the first embodiment of a composite vapor-deposition material according to the present invention, showing a composite vapor-deposition material having a cylindrical aluminum body 1 and low vapor-pressure metal/metalloid compound powder 2 dispersed in the aluminum substrate core region. Broken lines represent a region corresponding to the aluminum body core region 4, in which powder of a low vapor-pressure metal/metalloid compound is largely dispersed in aluminum. The end surfaces have an exposed portion of the low vapor-pressure metal/metalloid compound powder 2. In the aluminum body 1, the region other than the core region 4 is composed of aluminum. It is preferable to provide chamfers 3 for both ends of the cylinder.

In the present invention, an aluminum envelope, such as a sleeve, whose hollow is filled with a mixture of aluminum powder and powder of a low vapor-pressure metal/metalloid compound is subjected to cold working to reduce its diameter, so that the low vapor-pressure metal/metalloid compound powder placed therein is integrated in the core region of the aluminum body. As a low vapor-pressure metal/metalloid compound can be employed an oxide, nitride, carbide, silicide, nitro-oxide, carbo-nitride, carbo-oxide, silico-oxide, silico-nitride, or boride of a metal/metalloid element. As a metal/metalloid element, at least one element can be selected from the group consisting of Li, Be, Mg, Ca, Ti, V, Nb, Ta, Cr, Mo, W, Mn, Fe, Co, Ni, B, Al, C, Si, Sn, and Pb.

In order to integrate the aluminum powder and low vapor-pressure metal/metalloid compound powder with the aluminum envelope by cold working, it is desirable that the total reduction rate is set at 75% or higher. The total reduction rate is a rate of the cross section before cold working, S1, and the cross section after several times of cold working, S2, and expressed by: Reduction rate=(1−S2/S1)×100%.

For cold working or cold forming of an article comprising an aluminum envelope and a mixture of aluminum powder and low vapor-pressure metal/metalloid compound powder placed into its core region, it is preferable to employ extrusion or drawing (or wire drawing). In these processing processes, an aluminum envelope is compressed by passing it through wire-drawing or extruding dies, so as to make its diameter narrower and allow it to elongate longitudinally. During this compression and elongation, it is unnecessary to heat the aluminum body. It is probably that the aluminum powder compressed and elongated by cold working is got into the low vapor-pressure metal/metalloid compound powder, for example, by flowing with plasticity, or by local melting. In the metal envelope narrowly wire-drawn in this way, the low vapor-pressure metal/metalloid compound powder is dispersed and retained with aluminum, and the aluminum envelope and aluminum powder are integrated to form an aluminum body 1, obtaining a composite structure in which the low vapor-pressure metal/metalloid compound powder 2 is substantially dispersed in the core region 4 of this aluminum body 1. This cold working can be repeated to make a metal envelope longer and narrower to produce a metal wire. It is also possible to provide a step of annealing the metal wire together with the wire drawing step.

The aluminum powder disperses and retains the low vapor-pressure metal/metalloid compound powder, and thus has a function as a binder which integrally joins the low vapor-pressure metal/metalloid compound powder to the core region of the aluminum body. In order to exert binder effects successfully, it is preferable from the viewpoint of manufacturing an elongated composite vapor-deposition material of the present invention to specify the particle size of the low vapor-pressure metal/metalloid compound powder and aluminum powder, as well as the mixing ratio of the aluminum powder and low vapor-pressure metal/metalloid compound powder. If the amount of the aluminum powder is extremely small relative to the amount of the low vapor-pressure metal/metalloid compound powder, then the low vapor-pressure metal/metalloid compound powder is likely to exfoliate from the lateral side when an elongated composite vapor-deposition material is cut into chips. In contrast, if the amount of the low vapor-pressure metal/metalloid compound powder is too small relative to the amount of the aluminum powder, then binder effects are sufficient, but there may be not provided functions as composite material. It is desirable that an aluminum powder integrates with an aluminum envelope, so as to wrap low vapor-pressure metal/metalloid compound powder, but it could be sufficient, if there is given an effect of maintaining the joining of the aluminum envelope and low vapor-pressure metal/metalloid compound powder even at such a condition that particles of the low vapor-pressure metal/metalloid compound powder are observable.

It is likely that when the percentage of particles having large particle sizes in the powder is increased, the distribution of the low vapor-pressure metal/metalloid compound powder particles in the longitudinal direction of an elongated composite vapor-deposition material does not become uniform. Therefore, in order that the distribution of low vapor-pressure metal/metalloid compound powder particles is made uniform, the percentage of particles having small particle sizes is controlled, or alternatively an appropriate average particle size is controlled. As the uniformity in the particle size is improved, the correspondingly improved uniformity of the particle distribution can be obtained in the longitudinal direction of a composite vapor-deposition material wire.

Hence, it is preferable that for the low vapor-pressure metal/metalloid compound powder, 70% or more of the whole particle number contains particles having a particle size of not more than 3 μm. In this case, the average particle size is preferably in the range of 0.05 to 4 μm. In addition, an average particle size in the rage of 0.05 to 2 μm is further desirable, in order to improve the uniformity of the distribution of dense particles.

For the particle size of the aluminum powder, 70 wt % or more of the powder has a diameter preferably not more than 75 μm, and further desirably not more than 40 μm. The average particle size is preferably from 1 to 40 μm. As aluminum powder can be used commercially available powder, and such powder can be prepared from aluminum melt by gas atomizing processes.

The appearance of the aluminum body should be in the shape of columns (cylinder, polyangular prism, etc.), sticks (pin or pellet), or line (wire). A wire is freely flexible to desired shapes. The aluminum body can made longer by connecting these bodies longitudinally. The geometry of the aluminum body can be in the shape of plates, sheets, and tetra angular prism, as well.

The degree of dispersing low vapor-pressure metal/metalloid compound powder in the aluminum body can be selected as appropriate. That is, the composition of a composite vapor-deposition material can be selected, depending on the composition of a composite vapor-deposited film to be produced by deposition. In the production of a composite deposited film, since an aluminum-rich layer is formed at first, it is necessary that the envelope portion of the a composite vapor-deposition material is made of aluminum, and since a layer rich in a low vapor-pressure metal/metalloid compound is formed over the aluminum-rich layer, that is, deposited thereafter, it is necessary that the low vapor-pressure metal/metalloid compound is placed into the core region of the composite vapor-deposition material. In order to produce a composite vapor-deposition material by cold working, the composite vapor-deposition material need be of material with good ductility. Low vapor-pressure metal/metalloid compound powder can be distributed uniformly in the core region on the cross section of the body, or distributed at a higher density around the center of the core region on the cross section of the body and at a lower density in the vicinity of the circumference on the cross section of the core region, or distributed in such a way that the density of the low vapor-pressure metal/metalloid compound powder is gradually decreased form the center of the cross section of the body to the circumference, for example. In the case where an aluminum body is linear or columnar, it is most preferable that the low vapor-pressure metal/metalloid compound powder is dispersed uniformly in the core region on the cross section of the aluminum body. With this structure, even if processing is performed to reduce the diameter of the aluminum substrate, the low vapor-pressure metal/metalloid compound powder is not exposed on the surface of the aluminum body with being preferable in terms of protecting the low vapor-pressure metal/metalloid compound powder. In this context, the cross section of the aluminum substrate means a cross section cut in the direction perpendicular to the longitudinal direction. Preferably, the metal body has a uniform powder distribution in the longitudinal direction.

The mixing ratio of the aluminum powder and low vapor-pressure metal/metalloid compound powder should be 0.1 to 19, as expressed by [low vapor-pressure metal/metalloid compound powder, wt %]/[aluminum powder, wt %]. Further desirably, the mixing ratio is set in the range of 0.2 to 10, thereby allowing the uniformity of the distribution of the mixed powder to be increased.

Low vapor-pressure metal/metalloid compound powder for use in a composite vapor-deposition material according to a first embodiment of the present invention can be utilized in the shape of ball, oval, hexahedron or octahedron or higher polyhedron, plates, flakes, needles, crushed rocks, sands, or amorphous forms in which the regularity in individual geometries is hardly observable, or mixture thereof. Additionally, combined particles in which plural particles are bound can be employed instead of single particles. Furthermore, one can employ not only particles made of a single element, but also a mixture of particles made of two or more elements, and alloy powder.

To the low vapor-pressure metal/metalloid compound powder can be used additives exerting the following effects: smoothing the surface of powder particles, preventing powder from charging, suppressing mutual friction or adsorption of powder particles, accelerating dispersion of powder particles, and others. The form of additives can be powder, particle, liquid, or an article in which at least one of them is mixed. For example, lubricants can be utilized, such as aluminum stearate and zinc stearate.

Figure 3:
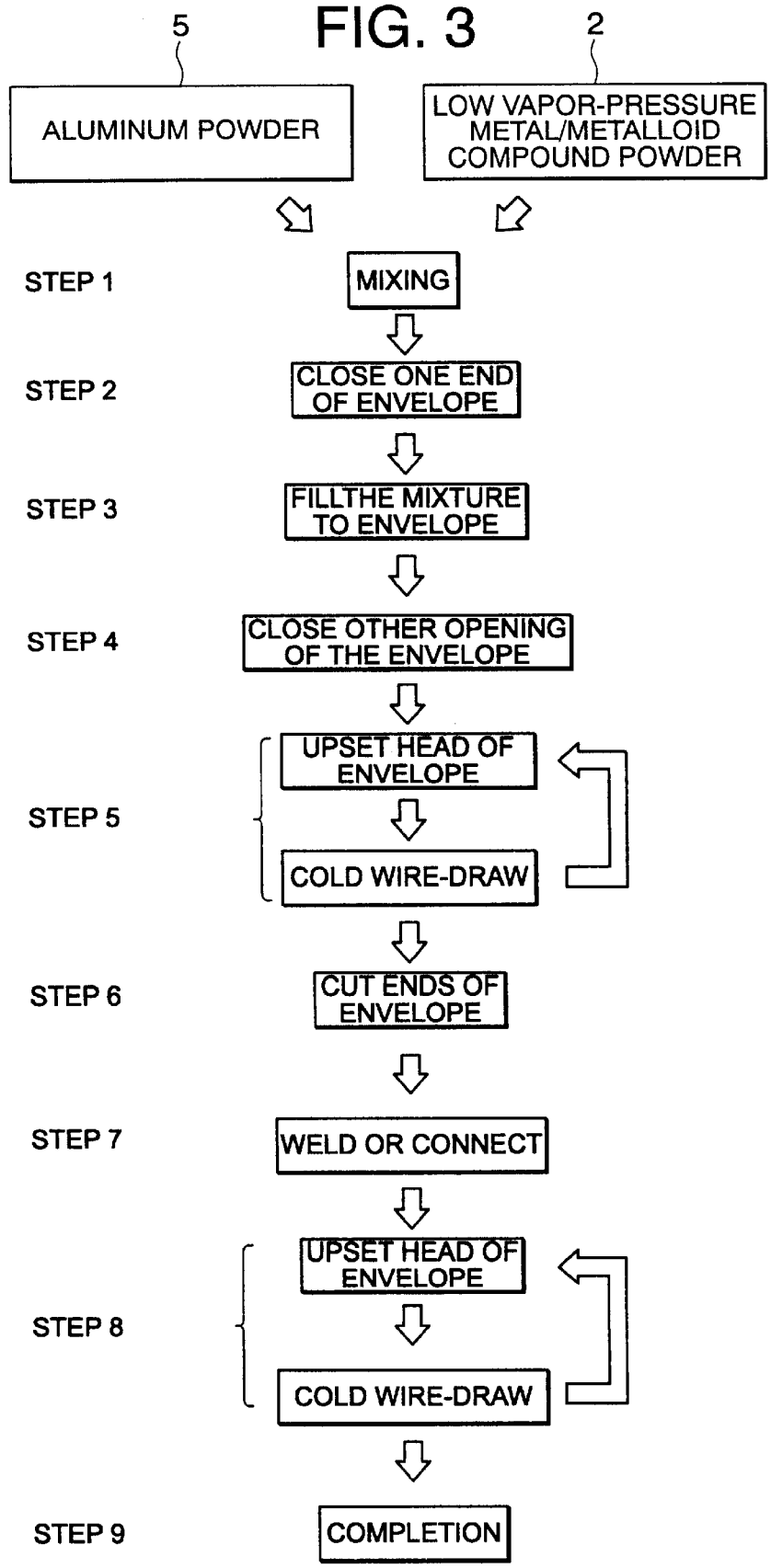
FIG. 3 is a block diagram illustrating the manufacturing process with respect to a composite material according to the present invention.
Figure 4:
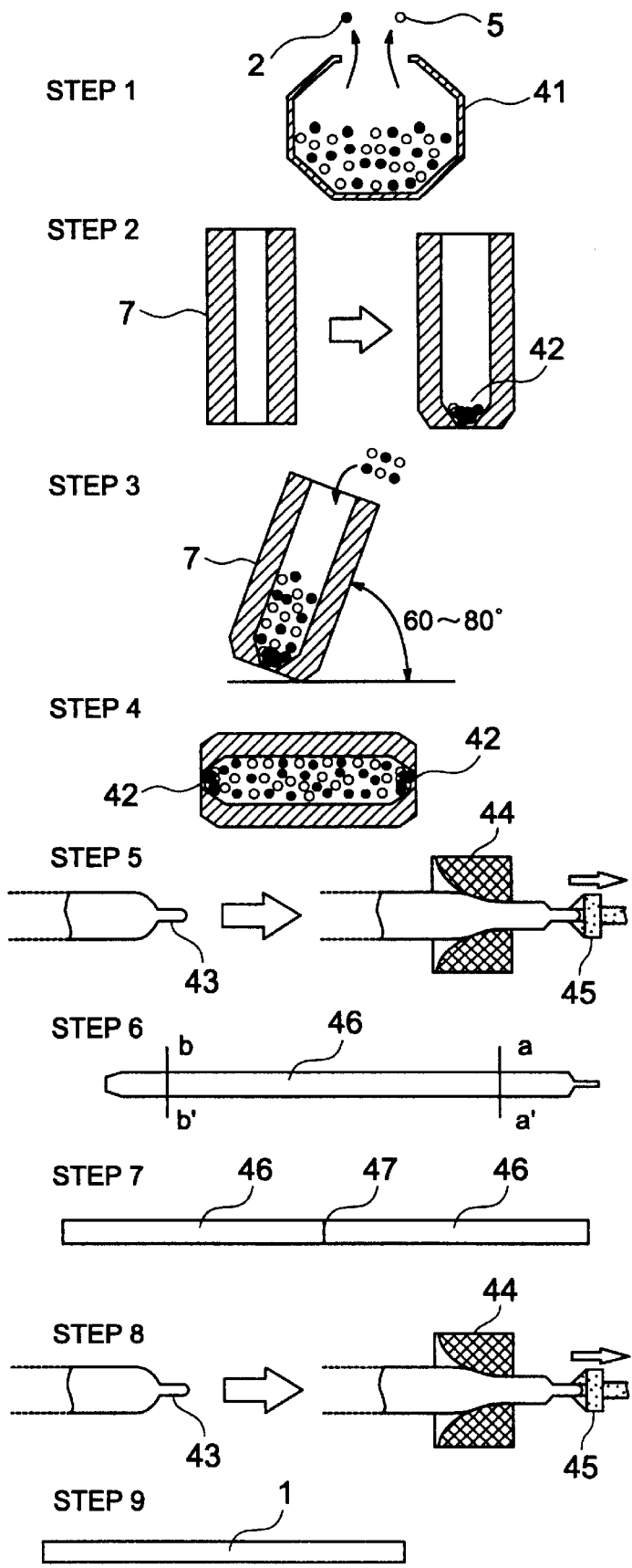
FIG. 4 is a schematic representation illustrating the manufacturing process with respect to a composite material according to the present invention.

One embodiment of the process for manufacturing a composite vapor-deposition material of the present invention will be explained in the process flow chart shown in FIG. 3 and FIG. 4. Aluminum powder 5 and low vapor-pressure metal/metalloid compound powder 2 are placed into a sealed container, for example, a V-typed mixer, filled with an inert gas, and the sealed container 41 is rotated and rocked to uniformly mix the aluminum powder 5 and low vapor-pressure metal/metalloid compound powder 2 (step 1). A sealed container made of metal is employed, and a portion of the container is grounded, such that the charging of static electricity is prevented and the probability of explosion is reduced, thereby allowing these powders to be mixed without any danger.

The low vapor-pressure metal/metalloid compound powder 2 has poor ductility, and for this reason, when mixed with a ductile powder like aluminum or its alloy, and when the resulting mixed powder has low fluidity, cold working cannot be carried out successfully. Therefore, it is necessary that the mixed powder has fluidity to such an extent that cold working can be carried out. To this end, it is preferable that the mixed powder has an angle of repose of not more than 60 degrees, and more preferably not more than 45 degrees. The angle of repose is defined by an angle relative to the base of the cone formed by a mixed powder when the mixed powder is allowed to free fall from a height of 10 cm toward a given point. In general, the smaller angle of repose is, the better fluidity of the powder is achieved.

Before putting mixed powder of aluminum powder 5 and low vapor-pressure metal/metalloid compound powder 2 into the hollow portion of an aluminum envelope 7, for example, an aluminum sleeve, it is preferable to wash with acid and with water, and dry, in order to remove attached materials, such as oil and others, and an oxidation coat, in particular, on the inner surface of the aluminum envelope.

Next, the inside diameter of one end of the aluminum envelope 7 is reduced to a small extent. The one end of the aluminum envelope 7 whose inside diameter has been reduced is plugged and closed with a breathable stopper, for example, a stopper 42 formed from stainless wire and balled into a shape like a cotton ball (step 2). The envelope 7 is inclined at angles of 60 to 80 degrees with respect to the horizontal plane, and supplied with the mixed powder through the opening at the other end of the envelope by free falling, followed by setting up the envelope at almost right angles to the horizontal plane to tamp the filled powder down using a small diameter stick (step 3). If the envelope is set up at angles of not less than 80 degree to fill the mixed powder, then the air within the envelope does not go out, and the mixed powder forms bridging, resulting in air retaining, so that the filling cannot be achieved fully. On the other hand, if the mixed powder is filled in the envelope of the angles of not more than 60 degrees and then the envelope is set up at almost right angles, the mixed powder tends to form bridging, and thus it is not preferable. The inclined angle of the envelope during filling the mixed powder into the envelope and the angle of repose of the mixed powder are controlled, so that it is possible to ensure that the envelope is filled with the mixed powder by free falling. After filling the mixed powder into the envelope, it is possible to increase the density of filling to a higher extent by applying vibration to the envelope, or by tamping it using a stick.

The opening at the other end of the envelope is plugged with a breathable stopper 42, and the diameter of the other end is reduced to close the opening through which the mixed powder has been filled (step 4). As a breathable stopper is preferably an article formed by balling 18 $\mu$m stainless wire into a shape like a cotton ball, and such a stopper combines breathability with a sufficient elasticity for fixing powder. This breathability functions as air vents for removing the air existing between particles in the mixed powder at the subsequent cold working step. Remove of the air within the powder can achieve rigid adherence between the aluminum substrate and the low vapor-pressure metal/metalloid compound powder.

The subsequent step is a cold working step in which the aluminum envelope 7 filled with the mixed powder is elongated. For cold working, extruding or drawing (also referred to as wire drawing) is employed. In this processing, the envelope is passed through dies for wire drawing or extruding, and compressed radially, so that the diameter is made narrower and longitudinal elongation is achieved.

One end of the envelope 7 is uniformly beaten to form a fixing part 43 having a smaller diameter than the hole diameters of the wire drawing dies, using an apparatus called a head-hitting machine. It is possible that the fixing part 43 has a length of about 40 mm. The fixing part 43 is passed through the hole of a wire drawing die 44, clamped with a tensile applying apparatus 45 to apply tensile loading to the fixing part, and thus the envelope 7 is drawn through the hole 44 of the wire drawing die. The speed of drawing is about 30 m/min., for example. The outside diameter of the drawn envelope is reduced by drawing it through the hole diameter of the die. The wire drawing die is then replaced with a die having a smaller hole diameter, and similar drawing steps are repeated to make the diameter of the envelope smaller. The fixing part 43 having a smaller diameter than the hole diameter of a wire drawing die is formed as needed. These procedures are repeated to reduce gradually the outside diameter and elongate the envelope, so as to obtain a metal wire 46 having a predetermined outside diameter (step 5). During the wire drawing step, although heat treatment is not applied to the metal envelope, it is likely that the aluminum powder compressed at the cold working step flows with plasticity, and heat generation caused by friction between powders results in locally melting, so that the aluminum powder comes into the low vapor-pressure metal/metalloid compound powder. It is supposed that the aluminum is filled between the aluminum envelope thus narrowly drawn and the low vapor-pressure metal/metalloid compound powder and integrated, so that there can be obtained a structure in which the low vapor-pressure metal/metalloid compound powder is substantially dispersed in the core region of the aluminum body.

The end portions in which a breathable stopper is plugged are cut off at the lines a–a' and b–b' to produce a wire material having a predetermined diameter, for example, a diameter of 2 mm, and having the low vapor-pressure metal/metalloid compound powder dispersed in the core region of the aluminum body (step 6). This wire material can be formed into composite material chips having the low vapor-pressure metal/metalloid compound powder dispersed in the core region of the aluminum body by cutting it in a predetermined length and carrying out chamfering.

In the dividing step, the metal wire is cut into pieces in a predetermined length by threading, cutting, and the like to produce composite material in chips. Subsequently, chamfering is performed, such that automatically supplying is carried out with ease by a part feeder or the like, in part removing burrs formed on the end surface of the chips. It is desirably that at least corner on the lateral side of the vapor-deposition material (longitudinal side) is removed by chamfering. It is also possible to carry out simultaneously cutting wire into pieces and chamfering or end rounding. Also, the corner at the end portion can be squashed toward the lateral side to carry out end rounding.

Alternatively, instead of carrying out cold working to a predetermined outside diameter at step 5, at a stage where a outside diameter having not more than a given one (for example, 7.5 mm) is reached, a portion having a length of about 100 mm portion where a stopper 42 for preventing the outflow of the mixed powder is plugged is cut off at a–a' and b–b', such that there is obtained metal wires 46 having a length of about 1.9 m and having the low vapor-pressure metal/metalloid compound powder dispersed in the core region of the aluminum body (step 6). These metal wires 46 are connected at the end with each other by butt resistance welding and others, so that plural wires are connected to produce a metal wire having a desired length. Bulging at the seam 47 in the connecting portion is processed by filing and the like to have almost the same diameter as the metal wire 46 (step 7).

The connected, lengthened metal wires are further subjected to gradually reducing the outside diameter in a similar way shown in step 5. As a wire material is elongated by repeating wire drawing, the wire-drawn wire material can be wound on a roll, besides clamping it by a tensile applying apparatus 45 to draw it linearly. Wire drawing is carried out to reach an intended diameter, for example, a diameter of 2 mm (step 8). This metal material is cut in a predetermined length and subjected to chamfering as described above, and thus a composite material 1 is formed into in which the low vapor-pressure metal/metalloid compound powder is dispersed in the core region of the aluminum body (step 9).

Figure 5:
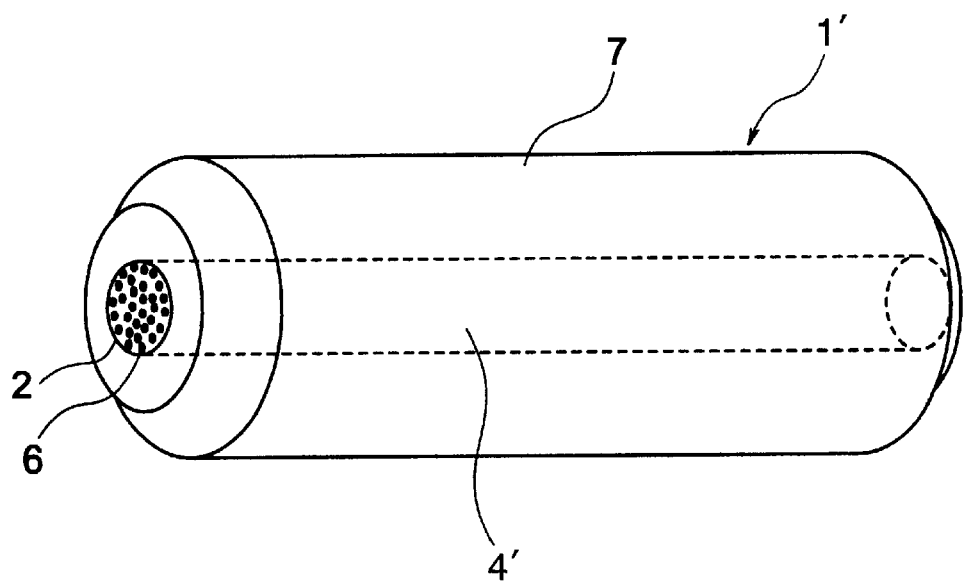
FIG. 5 is a perspective view of a composite vapor-deposition material according to a second embodiment of the present invention.

FIG. 5 shows a perspective view of a second embodiment 1' of a composite vapor-deposition material according to the present invention. In this figure, the reference number 7 represents an aluminum envelope, and the reference number 2 represents low vapor-pressure metal/metalloid compound powder. The core region 4' of the composite vapor-deposition material 1' contains a mixture of aluminum powder and low vapor-pressure metal/metalloid compound powder. This core region 4' is surrounded by a foil or layer 6 made of a metal having a further lower vapor pressure. The aluminum envelope 7, aluminum powder, and low vapor-pressure metal/metalloid compound powder are the same as those employed in the composite vapor-deposition material 1 according to the first embodiment shown in FIGS. 1 and 2. The foil or layer 6 surrounding the core region 4' and made of a metal having a further lower vapor pressure is preferably made of a metal like niobium, tantalum, rhenium, tungsten and molybdenum.

This composite vapor-deposition material 1' can be manufactured by inserting a foil or sleeve made of a metal having a further lower vapor pressure along the inner wall of the hollow portion of an aluminum sleeve, filling the hollow portion with a mixture of aluminum powder and low vapor-pressure metal/metalloid compound powder, and cold working, for example, cold wire drawing, in a similar way as in the first embodiment described above.

Aluminum metal and a low vapor-pressure metal/metalloid compound can be deposited onto a substrate to be deposited by heating a composite vapor-deposition material 1, 1' of the present invention under reduced pressure. At the initial stage of the vapor deposition, a deposited layer made of aluminum is formed, since the circumference of the composite vapor-deposition material is covered with aluminum metal. Even when the low vapor-pressure metal/metalloid compound is present in a small extent at the ends of the composite vapor-deposition material, and the vapor-deposited layer formed at the initial stage of the vapor deposition may contain very little amount of the low vapor-pressure metal/metalloid compound. After the deposition progresses and the aluminum existing in the envelope of the composite vapor-deposition material has been almost gone, the core region is exposed so that the aluminum and low vapor-pressure metal/metalloid compound vaporize. At this stage, vaporization of aluminum and the metal/metalloid compound takes place, depending on the difference in the vapor pressure. For this reason, there is formed a vapor-deposited layer composition which is rich in aluminum and into which little amount of the low vapor-pressure metal/metalloid compound is mixed. Thus, as the aluminum vaporizes at first and is reduced, the vapor-deposited layer composition has a gradually increasing concentration of the low vapor-pressure metal/metalloid compound, and during this period, a so-called gradient composition is formed, yielding a vapor-deposited layer composition largely resulting from the low vapor-pressure metal/metalloid compound at the final stage.

When nickel oxide is employed as a low vapor-pressure metal compound to prepare a composite vapor-deposition material as shown in FIGS. 1 and 2 and a composite vapor-deposited film is formed using the fluorescent screen of a CRT as a substrate to be deposited, a composite vapor-deposition film can be formed which contains almost 100% aluminum at the initial stage of the vapor deposition and almost 60% nickel oxide at the final stage of the vapor deposition. Even if this composite vapor-deposited film is heated from 400 to 450° C. for 30 minutes, none of the nickel oxide is diffused into the aluminum layer attached at the initial stage of the vapor deposition, and the aluminum layer retains a high reflectance, thereby allowing to produce CRTs with high brightness.

Similarly to the alternative embodiment shown in FIG. 5, when vapor deposition is performed with a composite vapor-deposition material having the core region 4' of a high vapor-pressure metal envelope 7 surrounded by a metal foil 6 having a further lower vapor pressure, it is possible to bring about steeper concentration changes of the composition in the vapor-deposited film. At the initial stage of the vapor deposition, only the aluminum existing in the envelope portion of the composite vapor-deposition material vaporizes, and the low vapor-pressure metal/metalloid compound has a contribution only resulting from the portion in the vicinity of the ends, and therefore, the composition of the low vapor-pressure metal/metalloid compound in the vapor-deposited film is at quite a small level. After all the aluminum present in the envelope portion of the composite vapor-deposition material vaporizes, the metal foil or layer having a further lower vapor pressure emerges on the surface, but the speed of vaporization is low due to a highly low vapor pressure. Therefore, after the aluminum vapor within a deposition chamber becomes thin, the vaporization of the metal having a further lower vapor pressure and forming the foil or layer takes place. The vaporization of a metal compound of which the core is composed takes place after part of this foil or layer is broken. For these reasons, it is likely to result in an increase in composition concentration changes in the vapor-deposited film.

EXAMPLE 1

A composite vapor-deposition material shown in FIGS. 1 and 2 was manufactured to form onto the inner surface of a CRT face plate a composite vapor-deposited film in which aluminum and nickel oxide layers are laminated. This composite vapor-deposition material had dimensions of 2.0 mm outside diameter and of 14 mm length, and an end chamfer C of 0.3 mm. This composite vapor-deposition material had the core region 4, shown by broken lines in the figures, whose diameter was about 0.8 to 1.1 mm and in which low vapor-pressure metal compound powder 2 of nickel oxide was dispersed and retained with aluminum powder in the core region 4 of the aluminum body 1.

In order to manufacture this composite vapor-deposition material, as the aluminum envelope was employed an aluminum tube having an outside diameter of 15.0 mm, an inside diameter of 9.5 mm, and a length of 350 mm, as the aluminum powder was used one having an average particle size of 30 $\mu$m, and as the low vapor-pressure metal compound powder was used nickel oxide powder having an average particle size of 0.3 $\mu$m.

A mixed powder was prepared by mixing a ratio of 60 wt % nickel oxide powder and 40 wt % aluminum powder under an inert gas. The mixed powder had an angle of repose of 30 to 40 degrees, when the mixed powder was subjected to free falling from a height of 10 cm. The mixed powder was filled into the aluminum tube, and both openings of the aluminum tube were plugged with stoppers into which 18 $\mu$m diameter stainless steel wire was rounded, followed by subjecting the aluminum tube to cold wire drawing until an outside diameter of 2.0 mm of the aluminum tube and a diameter of 1.05 mm of the core region were obtained by the cold wire drawing process shown in FIGS. 3 and 4. The nickel oxide content in the finished aluminum wire was about 14.1 wt %. The apparent specific gravity of the core region was about one-half of the true specific gravity.

Figure 6:
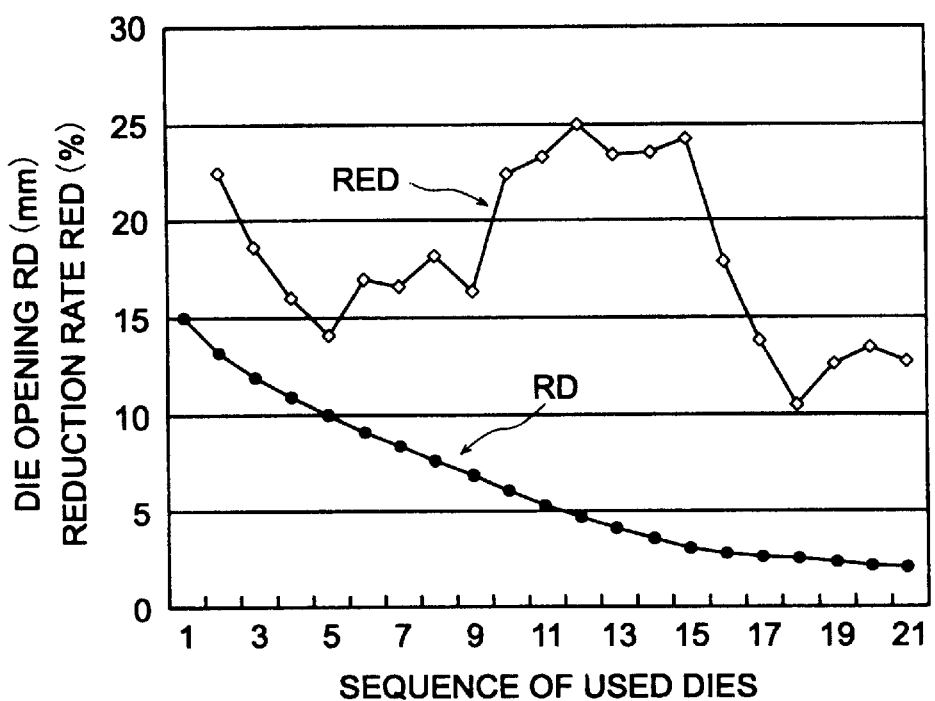
FIG. 6 is a graph showing the die hole diameter, Rd (mm), and the reduction rate, Red (%), at every stage of the sequence of used dies in the cold wire drawing step during the production of a composite vapor-deposition material according to the present invention.

In processing the aluminum tube to reduce the outside diameter from 15.0 mm to 2.0 mm at the cold wire drawing step, 20 wire-drawing dies were used with a reduction rate of about 10 to 25% in the cross section set per wire drawing. FIG. 6 shows the hole diameter, Rd (mm), of the dies employed in this step and the reduction rate, Red (%). The reduction rate is: Red=(1−[the cross section after wire drawing]/[the cross section before wire drawing])×100 (%). When the outside diameter reached 4.5 mm, the aluminum powder and the aluminum tube were formed into an integrated aluminum body, so that it was possible to obtain an aluminum wire having a structure in which the nickel oxide powder was dispersed in the core region of the aluminum body. Cold wire drawing was carried out at room temperature and at atmospheric pressure. However, it is possible that hot wire drawing is carried out to increase the wire drawing rate per wire drawing and decrease the number of drawing dies, but in this case, it is necessary to take measures to prevent aluminum oxidation caused by the atmospheric oxygen within the aluminum tube. For this reason, it can be concluded that it is easier from the viewpoint of manufacturing to reduce the reduction rate per wire drawing and increase the number of wire drawing operations.

Next, in order to obtain chips having a predetermined length from an aluminum wire, the wire-drawn aluminum wire was cut into pieces in 14 mm length by a cutting machine. Chamfering was carried out on a lathe, however processing with a press is also possible. It is also possible to carry out simultaneously cutting and chamfering or end rounding. The shape of round bars was made to which chamfers as shown in FIGS. 1 and 2 were provided, so that even if these composite vapor-deposition materials were aligned and conveyed in a vibration-typed part feeder, they were able to be supplied to a vapor-depositing machine without any problem. When supplying experiments were carried out also with composite vapor-deposition materials not subjected to chamfering, satisfactory aligning and conveying were not achieved, since the end surfaces of the composite vapor-deposition materials caught on the side wall of the part feeder and the composite vapor-deposition materials caught mutually. When the chamfering was carried out at C 1 mm, that is, when the end portion was made conic, one composite vapor-deposition material piece was slipped under another, and thus satisfactory aligning and conveying were not achieved also in this case. From these results, it is likely that chamfers of C 0.3 to 0.6 mm are most satisfactory values to aligning and conveying. These optimal chamfer dimensions are the case with a composite vapor-deposition material shape having an outside diameter of 2 mm and a length of 14 mm. Optimal values vary depending on the outside diameter and length, however, it is preferable to carry out chamfering at about 15 to 30% of the outside diameter value. C chamfering was carried out in this Example, however r radiusing with a curved surface instead of a chamfer is possible.

Figure 7:
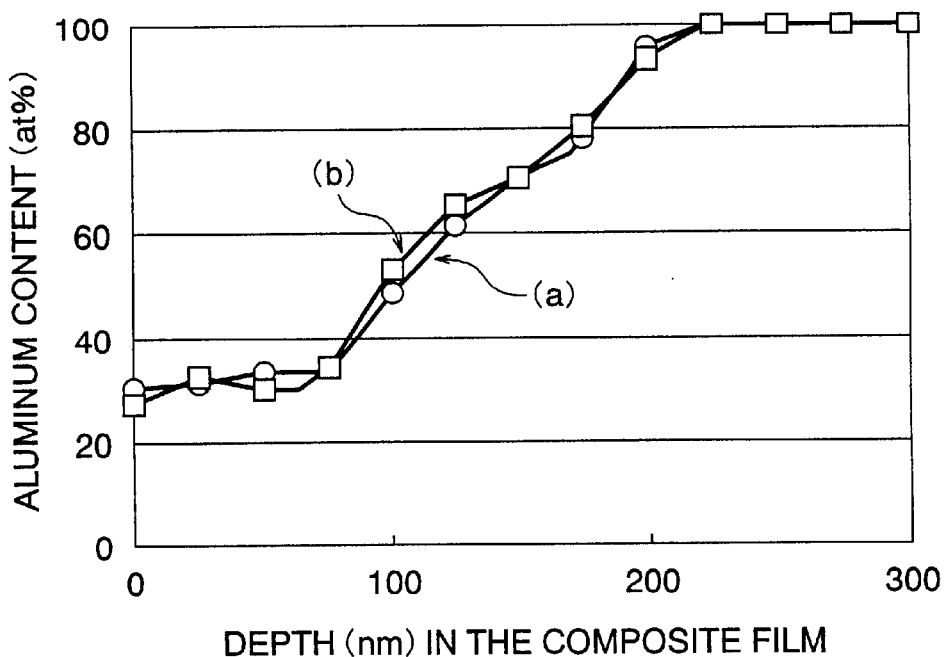
FIG. 7 is a graph showing the relationship between the aluminum content (atom %) and the vapor-deposited film depth (nm) before heat treatment (a) and after heat treatment (b) of a vapor-deposited film with a composite vapor-deposition material of the present invention.
Figure 8:
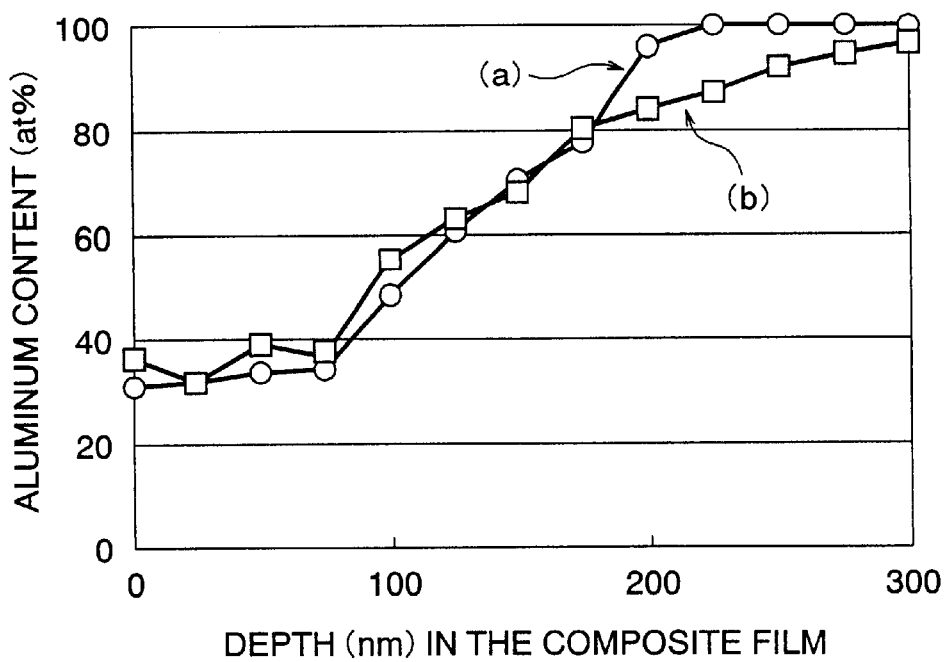
FIG. 8 is a graph showing the relationship between the aluminum content (atom %) and the vapor-deposited film depth (nm) before heat treatment (a) and after heat treatment (b) of a vapor-deposited film with a comparative composite vapor-deposition material.

FIGS. 7 and 8 show the relationship between the composition and the thickness of the films formed by deposition employing composite vapor-deposition materials of the present invention and for comparison. The curves (plotting) in FIG. 7 indicate results obtained by employing a composite vapor-deposition material of the present invention, and those in FIG. 8 indicate results obtained by employing a composite vapor-deposition material for comparison. The vapor-deposition material for comparison is a composite vapor-deposition material manufactured in a similar way described above by employing metallic nickel powder having an average particle size of 0.3 μm, instead of the nickel oxide powder employed in the above-described section of Example 1, and using in the core region of an aluminum tube a mixed powder obtained by weighing and mixing 86 wt % aluminum powder and 14 wt % metallic nickel powder. The comparative composite vapor-deposition material had dimensions of 2 mm outside diameter, of 14 mm length, and of 0.3 mm chamfer, as in Example 1.

The composite vapor-deposition materials of the present invention and for comparison were used to form vapor-deposited films. A vapor-deposition material and a glass substrate were placed in the bell-jar of a vacuum apparatus, and the deposition materials were heated and vaporized to form on the glass substrate a composite vapor-deposited film of aluminum and nickel oxide or nickel. The composite vapor-deposited films were a laminated film having an aluminum-rich layer on the glass substrate, that is, at the initial stage of the vapor deposition, and a vapor-deposited film rich in nickel oxide or nickel at the final stage of the vapor deposition. The glass substrates used were ones having a composition free of aluminum and nickel, in order to increase the analysis accuracy.

The deposition conditions were a reduced pressure of 0.01 Pa, an applied voltage of 3.5 V, and a deposition time of 100 seconds. The tray of boron nitride (BN) for loading vapor-deposition materials was used. The vapor-deposited film thickness was set at 300 nm. The film composition in the depth direction of the film deposited on the glass substrate was analyzed with an Auger analyzer.

As indicated by (a) in FIGS. 7 and 8, both when the composite vapor-deposition material of the present invention was employed (using of nickel oxide) and when the composite vapor-deposition material for comparison was employed (using of nickel), the film composition were almost 100% aluminum at the initial stage of the vapor deposition, and 30% aluminum at the final stage of the vapor deposition.

In both the composite vapor-deposition materials of the present invention and for comparison, at the initial stage of the vapor deposition, the aluminum of which the envelope (tube) was composed vaporized, and the nickel oxide or nickel present in the core region vaporized in only a small amount. It is supposed that after most portion of the envelope had been vaporized, the mixing of the aluminum and nickel oxide or nickel particles present in the core region began, so that both vaporized. At this stage, since the aluminum having a high vapor pressure primarily vaporized and the nickel oxide or nickel having a low vapor pressure vaporizes with mixing therewith, a vapor-deposited film was provided with a composition in which the aluminum and nickel oxide or nickel were mixed at intermediate deposition stages. At such intermediate deposition stages, a gradient composition was formed in which the aluminum was decreased gradually from the initial stage toward the final stage of the vapor deposition. At the final stage of the vapor deposition, the remaining nickel oxide or nickel primarily vaporized, and therefore the aluminum in the vapor-deposited film was in the order of 30%.

These vapor-deposited films were exposed to a funnel glass forming temperature, 400° C. to 450° C., for 30 minutes, followed by analyzing again the composition of the composite vapor-deposited films by the Auger analyzer. FIGS. 7(b) and 8(b) show depth-directional changes in the aluminum content in the composite vapor-deposited films formed by employing the composite vapor-deposition material of the present invention and the composite vapor-deposition material for comparison, respectively.

In the composite vapor-deposited films formed by employing the composite vapor-deposition materials of the present invention, as it can be seen from FIG. 7, there is little or no change of the film composition before heat treatment (a) and after heat treatment (b). In other words, heat treatment results in no diffusion of the nickel oxide into the aluminum layer attached at the initial stage of the vapor deposition.

In the composite vapor-deposited films formed by employing the vapor-deposition materials for comparison, however, as it can be seen from FIG. 8(b), applying heat treatment to the layer attached at the initial stage of the vapor deposition caused the diffusion of the nickel into the layer, and thus changed its composition in which the aluminum content was reduced to 98%.

As understood from this comparison, a composite vapor-deposition material containing metal oxide as in the present invention can stabilize the composition of a composite vapor-deposited film manufactured by employing it.

Figure 9:
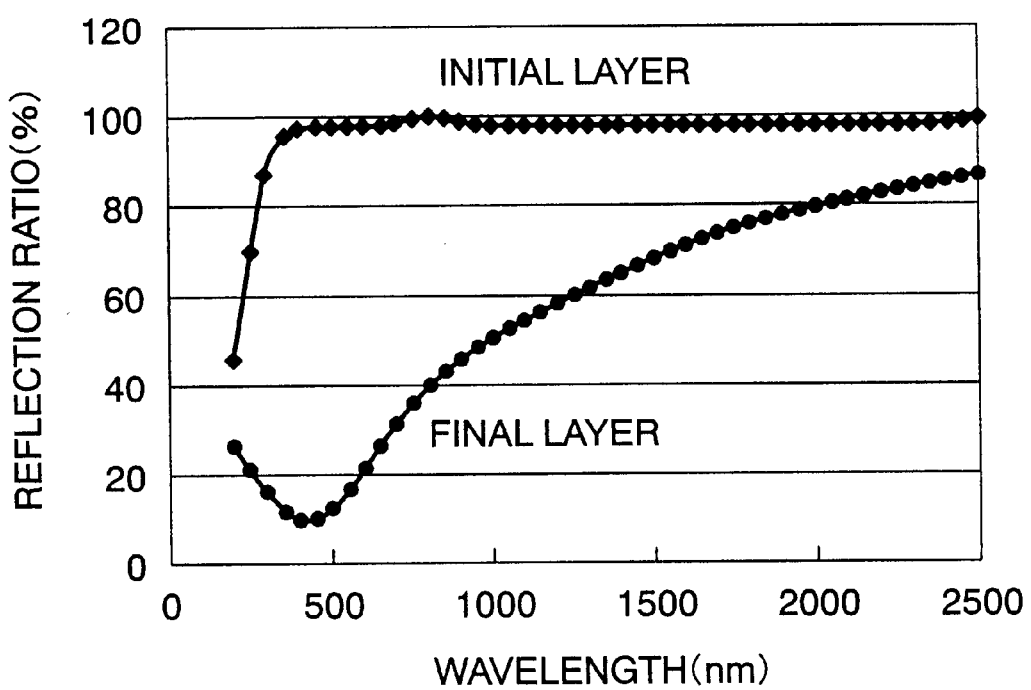
FIG. 9 is a graph showing the reflectance vs. measurement wavelength (nm) of a composite vapor-deposited film manufactured by the present invention.

Referring to FIG. 9, the following will describe the light reflectance of composite vapor-deposited films formed by employing a composite vapor-deposition material according to the Example 1 of the present invention. FIG. 9 shows the relationship of the light reflectance vs. light wavelength of respective layers formed at the initial stage and at the final stage of the vapor deposition in this composite vapor-deposited film. Measurements were carried out using a glass substrate deposited with pure aluminum as standard and defining the light reflectance of the pure aluminum vapor-deposited film as 100%, the reflectance is expressed by ratios relative to this aluminum film. The reflectance of the layer at the initial stage of the vapor deposition was measured through the glass. Samples measured were ones after annealing. The initial stage corresponds to the location at a depth of 300 nm in the depth direction, and the final stage corresponds to the location at 0 nm. The film at the initial stage of the vapor deposition displayed an light reflectance of 100% in the wavelength range of 200 nm to 2500 nm, and it can be understood that this reflectance is the same as that of the pure aluminum, indicating that annealing results in little or no diffusion of the nickel oxide and the aluminum layer at the initial stage of the vapor deposition does not contain the nickel oxide. This is consistent with the results of Auger analysis shown in FIG. 7. The layer at the final stage of the vapor deposition had a lower light reflection performance with the light reflectance with respect to the light at a wavelength of 1000 nm being about 50% of that of the pure aluminum. That is, there was provided a layer having a high level of absorbing heat rays.

The inventor compared deviations (thermal drifts) of the electron beam by the temperature of a color CRT employing the composite vapor-deposited film manufactured with the composite vapor-deposition material of the Example 1 with those of a color CRT having a film of pure aluminum. Both color CRTs were 21-inch color monitors for computers. In order to carry out vapor deposition on the surface of about 210 square inches, 55 mg vapor-deposition material pieces were placed at two sites, and the total of 110 mg was used. Since the composite vapor-deposited film manufactured with the composite vapor-deposition material of Example 1 contains nickel oxide, causing a slightly increase in absorbing the electron beam, the cathode current was adjusted so as to obtain the same brightness. In order to achieve the same brightness, it was necessary to increase the cathode current by about 7% in the case of the color CRT having the composite film containing nickel oxide, as compared with the color CRT having the film of pure aluminum. As the cathode current was increased, the temperature of the shadow mask rose and the shadow mask was expanded to a greater extent. This means that the color CRT having the composite film containing nickel oxide undergoes severer conditions, as compared with the color CRT for comparison. If the thermal drift of the CRT having the film of pure aluminum is defined as 100%, the thermal drift of the CRT manufactured with the composite vapor-deposition material of the present invention was 58 to 64%, indicating that the thermal drift was improved by about 40%.

EXAMPLE 2

An aluminum tube having dimensions of 15.0 mm outside diameter and of 9.5 mm inside diameter was filled with a mixed powder of 40 wt % silicon carbide powder and 60 wt % aluminum powder, and subjected to wire drawing until the outside diameter reached 2.0 mm. The diameter of the core region having a dispersed silicon carbide powder was about 0.94 mm after wire drawing, and the overall content of the silicon carbide was about 5.4 wt %. The silicon carbide powder used was manufactured by a jet mill and had an average particle size of 0.3 $\mu$m.

EXAMPLE 3

Molded articles having dimensions of 9.3 mm outside diameter and of 2 mm length were also formed by mixing 50 wt % aluminum nitride powder and 50 wt % aluminum powder and using a hydraulic press of a compacting pressure of 2.9 to 6.8×10$^{-7}$ (N/m$^2$) (0.3 to 0.7 (tons/cm$^2$)). These molded articles had an apparent specific gravity in the order of about 60% of the true specific gravity and were easily crushable manually. These molded articles were inserted and filled into an aluminum tube having an outside diameter of 15.0 mm and an inside diameter of 9.5 mm. The aluminum tube was subjected to wire drawing until the outside diameter reached 2.0 mm. The diameter of the core region having a dispersed aluminum nitride powder was about 1.0 mm after wire drawing, and the overall content of the aluminum nitride was about 7.5 wt %. The aluminum nitride powder used was manufactured by a jet mill and had an average particle size of 0.5 $\mu$m.

EXAMPLE 4

An aluminum tube having dimensions of 15.0 mm outside diameter and of 9.5 mm inside diameter was filled with a mixed powder of 50 wt % boron nitride powder and 50 wt % aluminum powder, and subjected to wire drawing until the outside diameter reached 2.0 mm. The diameter of the core region having a dispersed boron nitride powder was about 0.95 mm after wire drawing, and the overall content of the boron nitride was about 5.9 wt %. The boron nitride powder used was manufactured by a jet mill and had an average particle size of 1.2 $\mu$m.

EXAMPLE 5

An aluminum tube having dimensions of 15.0 mm outside diameter and of 9.5 mm inside diameter was filled with a mixed powder of 60 wt % magnesium boride powder and 40 wt % aluminum powder, and subjected to wire drawing until the outside diameter reached 2.0 mm. The diameter of the core region having a dispersed magnesium boride powder was about 1.0 mm after wire drawing, and the overall content of the magnesium boride was about 9.1 wt %. The magnesium boride powder used was manufactured by a jet mill and had an average particle size of 0.5 $\mu$m.

EXAMPLE 6

An aluminum tube having dimensions of 15.0 mm outside diameter and of 9.5 mm inside diameter was filled with a mixed powder of 50 wt % silicon carbide powder and 50 wt % aluminum powder, and subjected to wire drawing until the outside diameter reached 2.0 mm. The diameter of the core region having a dispersed silicon carbide powder was about 0.95 mm after wire drawing, and the overall content of the silicon carbide was about 6.8 wt %. The silicon carbide powder used was manufactured by a jet mill and had an average particle size of 3.5 $\mu$m.

EXAMPLE 7

An aluminum tube having dimension of 15.0 mm outside diameter and of 9.5 mm inside diameter was filled with a mixed powder of 30 wt % silicon carbide powder, 20 wt % boron carbide, and 50 wt % aluminum powder, and subjected to wire drawing until the outside diameter reached 2.0 mm. The diameter of the core region having a dispersed silicon carbide powder and boron carbide powder was about 0.95 mm after wire drawing, and the overall content of the silicon carbide and boron carbide was about 6.8 wt % in total. The silicon carbide and boron carbide powders used were manufactured by a jet mill and had an average particle size of 3.5 $\mu$m and 2.2 $\mu$m, respectively.

Composite vapor-deposited films were manufactured employing the composite vapor-deposition materials of Examples 2 to 7 to analyze the film compositions in the depth direction before and after annealing. They displayed similar composition distributions as that in FIG. 7.

The ratios of cathode currents to achieve the same brightness as that in the CRT employing the vapor-deposited film of pure aluminum were determined. The thickness of the vapor-deposited film was set to be 300 nm. When the cathode current was defined as 1 for the aluminum vapor-deposited film, the cathode currents were 1.07 for the combination of aluminum and nickel oxide, 1.05 for the combination of aluminum and silicon carbide, 1.02 for the combination of aluminum and silicon monoxide, 1.02 for the combination of aluminum and magnesium boride, and 1.01 for the combination of aluminum and boron nitride. It can be understood from these results that compounds of light elements having an atomic number of 20 or less, such as Li, Be, B, C, Mg, Al, Si, Ca, and others, have a low level of absorbing the electron beam, and its combinations with aluminum are effective as materials for vapor-deposited films.

What is claimed is:

1. A method for forming a composite vapor deposited film having an initial vapor deposited layer of aluminum, a final vapor deposited layer containing aluminum and metal/metalloid compound having a vapor pressure lower than that of aluminum, and an intermediate portion having a gradient aluminum composition, comprising the steps of:

providing a composite vapor deposition material with an aluminum body and a core region in which powder of the metal/metalloid compound having a vapor pressure lower than that of aluminum is dispersed and retained with aluminum in the core region of the aluminum body;

heating the composite vapor deposition material under reduced pressure to vaporize the aluminum and the metal/metalloid compound, thereby carrying out vapor deposition onto a substrate to be deposited.

2. A method for forming a composite vapor-deposited film as set forth in claim 1, wherein the metal/metalloid compound powder having a vapor pressure lower than that of aluminum is at least one selected from the group consisting of an oxide, nitride, carbide, silicide, nitro-oxide, carbo-nitride, carbo-oxide, silico-oxide, silico-nitride, and boride of a metal/metalloid element.

3. A method for forming a composite vapor-deposited film as set forth in claim 2, wherein the metal/metalloid element is at least one selected from the group consisting of Li, Be, Mg, Ca, Ti, V, Nb, Ta, Cr, Mo, W, Mn, Fe, Co, Ni, B, Al, C, Si, Sn, and Pb.

4. A method for forming a composite vapor-deposited film as set forth in claim 2, wherein the metal/metalloid element is at least one selected from the group consisting of Li, Be, B, C, Mg, Al, Si, and Ca.

5. A method for forming a composite vapor-deposited film as set forth in claim 1, wherein the metal/metalloid compound powder having a vapor pressure lower than that of aluminum is at least one selected from the group consisting of nickel oxide, iron oxide, silicon carbide, aluminum nitride, boron nitride, and magnesium boride.

6. A method for forming a composite vapor-deposited film as set forth in claim 1, wherein the composite vapor-deposition material further comprises a metal layer surrounding the core region thereof and having a vapor pressure lower than that of the metal/metalloid compound.

7. A method for forming a composite vapor-deposited film as set forth in claim 6, wherein the metal/metalloid compound powder having a vapor pressure lower than that of aluminum is at least one selected from the group consisting of an oxide, nitride, carbide, silicide, nitro-oxide, carbo-nitride, carbo-oxide, silico-oxide, silico-nitride, and boride of a metal/metalloid element.

8. A method for forming a composite vapor-deposited film as set forth in claim 7, wherein the metal/metalloid element is at least one selected from the group consisting of Li, Be, Mg, Ca, Ti, V, Nb, Ta, Cr, Mo, W, Mn, Fe, Co, Ni, B, Al, C, Si, Sn, and Pb.

9. A method for forming a composite vapor-deposited film as set forth in claim 7, wherein the metal/metalloid element is at least one selected from the group consisting of Li, Be, B, C, Mg, Al, Si, and Ca.

10. A method for forming a composite vapor-deposited film as set forth in claim 6, wherein the metal/metalloid compound having a vapor pressure lower than that of aluminum is at least one selected from the group consisting of nickel oxide, iron oxide, silicon carbide, aluminum nitride, boron nitride, and magnesium boride.

* * * * *